(12) United States Patent
Lin et al.

(10) Patent No.: US 11,456,293 B2
(45) Date of Patent: Sep. 27, 2022

(54) POLYSILICON RESISTOR STRUCTURES

(71) Applicant: TAIWAN SEMICONDUCTOR MANUFACTURING CO., LTD., Hsinchu (TW)

(72) Inventors: Meng-Han Lin, Hsinchu (TW); Wen-Tuo Huang, Tainan (TW); Yong-Shiuan Tsair, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/549,077

(22) Filed: Aug. 23, 2019

(65) Prior Publication Data

US 2021/0057406 A1 Feb. 25, 2021

(51) Int. Cl.
*H01L 27/06* (2006.01)
*H01L 21/8234* (2006.01)

(52) U.S. Cl.
CPC .. *H01L 27/0629* (2013.01); *H01L 21/823418* (2013.01); *H01L 21/823437* (2013.01)

(58) Field of Classification Search
CPC ......... H01L 27/0629; H01L 21/823418; H01L 21/823437; H01L 27/11521; H01L 27/11526; H01L 29/42328; H01L 21/762; H01L 23/528; H01L 27/11534; H01L 27/11548; H01L 29/40114
USPC ... 257/379, 350, E21.598, E27.03, E21.616; 438/382, 383, 238, 283
See application file for complete search history.

(56) References Cited

U.S. PATENT DOCUMENTS

| 2009/0078988 A1* | 3/2009 | Higuchi | H01L 27/11517 257/324 |
| 2009/0090977 A1* | 4/2009 | Freeman | H01L 27/0629 257/379 |
| 2010/0148262 A1* | 6/2010 | Stahrenberg | H01L 28/20 257/350 |
| 2011/0117710 A1* | 5/2011 | Lin | H01L 27/0629 438/238 |
| 2011/0256677 A1* | 10/2011 | Chuang | H01L 27/0629 438/238 |
| 2013/0105912 A1* | 5/2013 | Hsu | H01L 27/0629 257/379 |
| 2013/0134519 A1* | 5/2013 | Sengoku | H01L 23/5256 257/364 |

(Continued)

FOREIGN PATENT DOCUMENTS

TW 201101422 A 1/2011

*Primary Examiner* — Mouloucoulaye Inoussa
(74) *Attorney, Agent, or Firm* — Sterne, Kessler, Goldstein & Fox P.L.L.C.

(57) ABSTRACT

The present disclosure describes a method for forming polysilicon resistors with high-k dielectrics and polysilicon gate electrodes. The method includes depositing a resistor stack on a substrate having spaced apart first and second isolation regions. Further the method includes patterning the resistor stack to form a polysilicon resistor structure on the first isolation region and a gate structure between the first and second isolation regions, and doping the polysilicon resistor structure to form a doped layer in the polysilicon layer of the polysilicon resistor structure and source-drain regions in the substrate adjacent to the gate structure. Also, the method includes replacing the polysilicon layer in the gate structure with a metal gate electrode to form a transistor structure.

20 Claims, 11 Drawing Sheets

(56) References Cited

U.S. PATENT DOCUMENTS

2015/0311272 A1* 10/2015 Romanescu ............ H01L 28/24
                                                    257/379
2017/0278954 A1*  9/2017 Amo ................. H01L 27/11582

* cited by examiner

POLYSILICON RESISTOR STRUCTURES

BACKGROUND

The operation of integrated circuits (IC) requires a combination of active components (e.g., transistors) and passive components (e.g., resistors, inductors, and capacitors), which can be formed on the same substrate. Resistors are primarily used in an IC as means to control the current flow to other components of the IC—for example, resistors can be used to divide the supply voltage into smaller increments.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
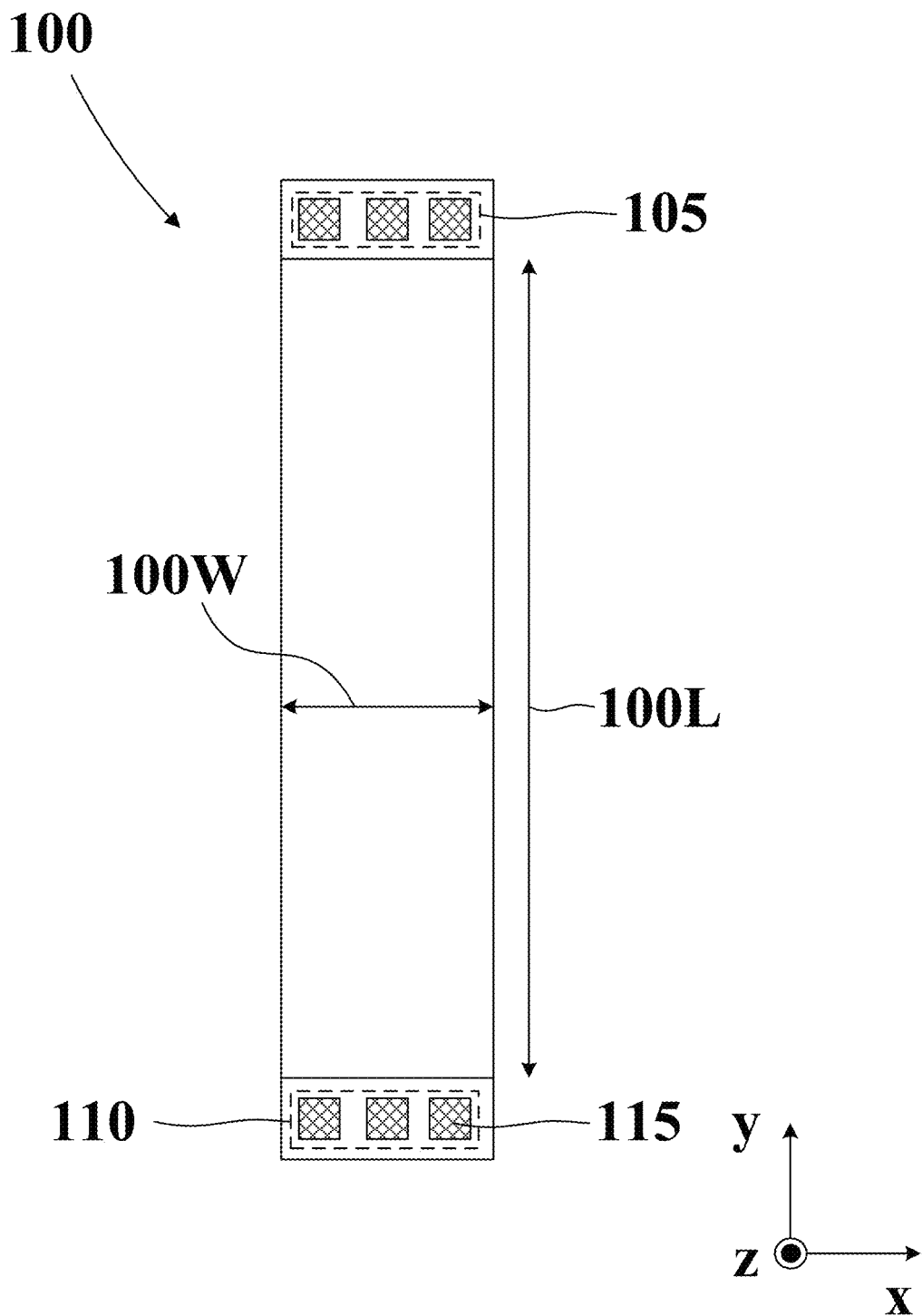
FIG. 1 is top down view of a polysilicon resistor structure, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the target value (e.g., ±1%, ±2%, ±3%, ±4%, ±5% of the target value).

The term "vertical," as used herein, means nominally perpendicular to the surface of a substrate.

A resistor is a passive electrical component used in electronic circuits to, for example, reduce current flow, adjust signal levels, divide voltages, and to bias active elements. In integrated circuits (ICs), resistors can be integrated and formed concurrently with other IC components—such as transistors, memory arrays, capacitors, etc. Important parameters for a resistor in an IC include sheet resistance, value tolerance (e.g., the percentage of error in the resistor's resistance), contribution to parasitic capacitances, temperature coefficient of resistance (TCR), and voltage coefficient of resistance (VCR). For example, TCR and VCR are metrics that can be used to evaluate the stability of the resistor's resistance within a temperature range or within a voltage range, respectively.

In IC manufacturing, metal gate (MG) materials and high-dielectric constant dielectric materials (e.g., high-k dielectric materials ("HK dielectric materials")) can be used for the fabrication of field effect transistors (FETs). Resistors and FETs can be fabricated concurrently in the IC; as such, MG and HK dielectric materials can be implemented in the resistor's fabrication process to simplify, harmonize, and streamline the manufacturing process between FETs and resistors.

In cases where resistors with higher sheet resistances are required (e.g., sheet resistances greater than about 500 $\Omega$/square), titanium nitride (TiN) can replace the metal gate material in the resistor structure. This is because resistors with MG material ("MG resistors") have a sheet resistance range between about 30 $\Omega$/square and about 130 $\Omega$/square, while resistors with TiN ("TiN resistors") have a sheet resistance between about 500 $\Omega$/square and about 1000 $\Omega$/square (e.g., one order of magnitude higher). However, the aforementioned types of resistors can suffer from poor current density—for example, MG resistors exhibit a maximum current density ("Jmax") between about 0.05×W and about 0.5×W and TiN resistors exhibit a Jmax between about 0.1×W and about 1×W mA, where "W" is the width of the resistor structure.

Embodiments of the present disclosure are directed to a method for forming resistors that combine HK dielectrics and polysilicon to form a polysilicon resistor that exhibits a wider sheet resistance range, higher Jmax, and improved performance compared to TiN and MG resistors. The resulting polysilicon resistor can be silicided or non-silicided and can be fabricated alongside devices that use HK/MG materials. In some embodiments, the resulting silicided resistors can have a Jmax between about 1×W and about 10×W mA, and the non-silicided polysilicon resistors can have a Jmax between about 0.1×W and about 1×W mA. Additionally, the silicided and non-silicided resistors exhibit a lower sheet resistance range when compared to their TiN and MG resistor counterparts. Further, the polysilicon resistors described herein are compatible with fabrication methods used for HK/MG devices.

According to some embodiments, FIG. 1 is a top view of a polysilicon resistor structure 100 having a width 100W and a length 100L where a ratio of the resistor's length to the resistor's width is greater than about 1—e.g., 100L/100W>1. Polysilicon resistor structure 100 further includes contact regions 105 and 110 with respective contact structures 115 formed thereon. In some embodiments, contact structures 115 include a conductive material such as cobalt (Co) or tungsten (W). Contact structures 115 electrically connect polysilicon resistor structure 100 to other components or areas of the IC and are not shown in FIG. 1 for simplicity. By way of example and not limitation, electric current ("current") in polysilicon resistor structure 100 flows from contacts 115 in contact structures in region 105 to contact structures 115 in contact region 110. Current in polysilicon resistor structure 100 flows either through a polysilicon layer or a silicide layer not shown in FIG. 1. Resistor structure 100 is not limited to the depiction of FIG. 1 and fewer or more contact structures 115 are possible. Further, contact structures 115 can have different sizes or shapes. Likewise, contact regions 105 and 110 can be larger or smaller depending on the resistor design and voltage or current requirements.

In some embodiments, the resistance of polysilicon resistor structure 100 can be modulated through its dimensions such as length 100L and width 100W. The dimensions of polysilicon resistor structure 100 can be defined via patterning (e.g., via photolithography and etching operations) according to the desired resistance value and other layout considerations (e.g., the minimum pitch to neighboring structures, etc.). In some embodiments, multiple polysilicon resistor structures, like polysilicon resistor structure 100, with different or similar resistance can be formed throughout the IC.

Figure 2:
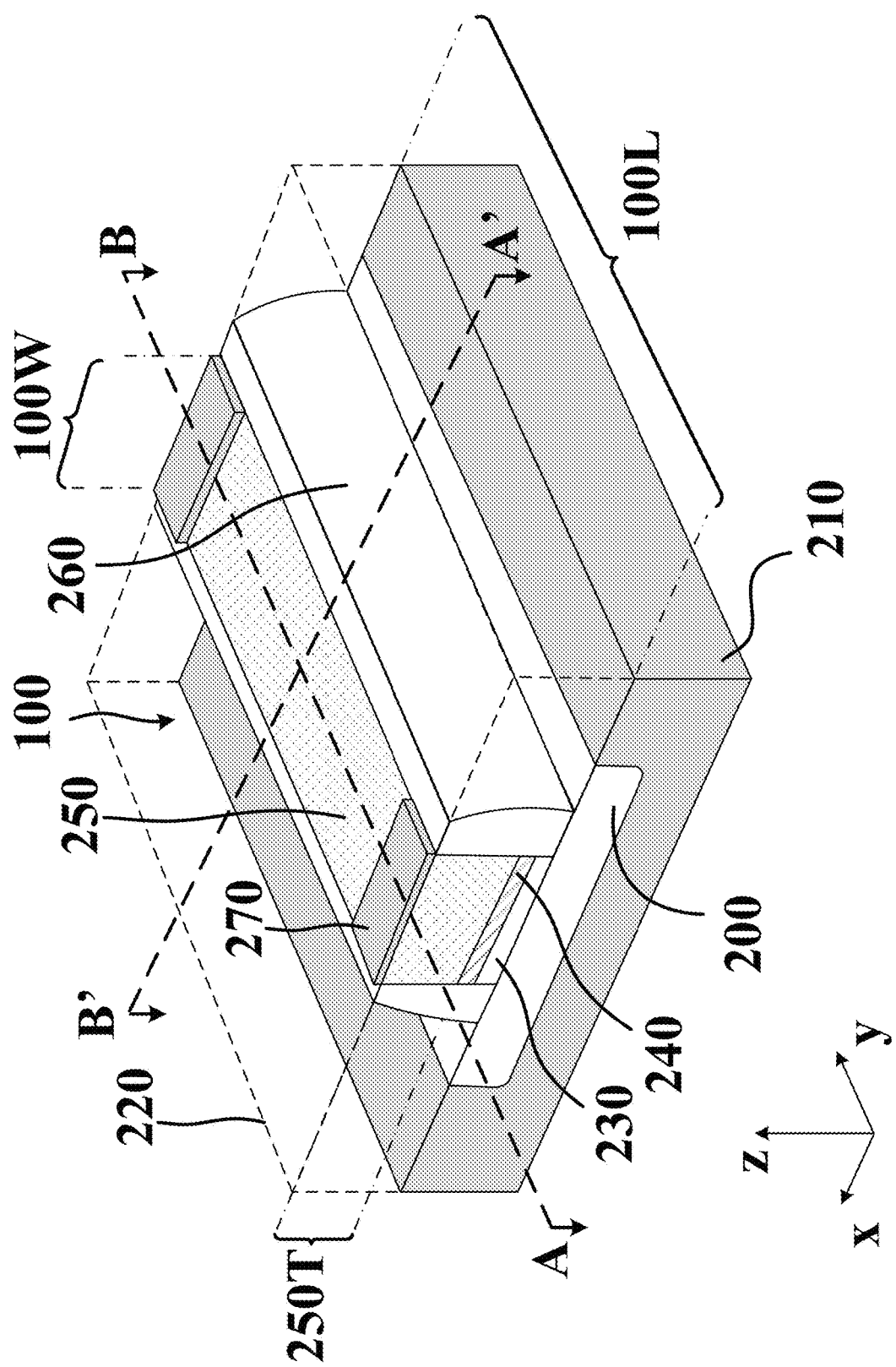
FIG. 2 is an isometric view of a non-silicided polysilicon resistor structure, in accordance with some embodiments.

In some embodiments, FIG. 2 is an isometric view of polysilicon resistor structure 100. By way of example and not limitation, FIG. 1 can be a top view of polysilicon resistor structure 100. Even though FIG. 2 does not show contact structures 115 of FIG. 1, FIG. 2 shows other structural elements of polysilicon resistor structure 100. For example, polysilicon resistor structure 100 is formed on an isolation region 200 embedded in a semiconductor substrate 210. In some embodiments, isolation region 200 can be a shallow trench isolation region (e.g., an STI region) that includes a dielectric material, such as silicon oxide ($SiO_2$) or a low-k dielectric material (e.g., with a k-value lower than about 3.9). Isolation region 200 is formed in semiconductor substrate 210 to provide electrical isolation between doped regions of semiconductor substrate 210. Isolation region 200 may extend laterally along the x-y plane of FIG. 2. According to some embodiments, semiconductor substrate 210 can include (i) silicon, (ii) a compound semiconductor such as gallium arsenide (GaAs), gallium phosphide (GaP), indium phosphide (InP), indium arsenide (InAs), and/or indium antimonide (InSb), (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP), or (iv) combinations thereof. For example purposes, semiconductor substrate 210 will be described in the context of crystalline silicon. Based on the disclosure herein, other materials, as discussed above, can be used. These materials are within the spirit and scope of this disclosure.

Polysilicon resistor structure 100 is laterally isolated from neighboring devices or structures (not shown in FIG. 2) through dielectric layer 220. In some embodiments, dielectric layer 220 can be an interlayer dielectric such as $SiO_2$, doped $SiO_2$, or any other suitable dielectric material with a dielectric constant equal to or less than about 3.9 (e.g., about 3.6, about 3.3). By way of example and not limitation, dielectric layer 220 surrounds the side surfaces of polysilicon resistor structure 100 as shown in FIG. 2.

In some embodiments, polysilicon resistor structure 100 includes a stack of (i) a HK dielectric layer 230 formed on isolation region 200, (ii) a metal nitride layer 240 formed on dielectric layer 230, and (iii) a polysilicon layer 250 formed on metal nitride layer 240. By way of example and not limitation, HK dielectric layer 230 can include a metal oxide, such as hafnium oxide, with a dielectric constant (k-value) greater than about 3.9 (e.g., between about 4.0 and about 40). In some embodiments, HK dielectric layer 230 has a thickness between about 2 Å and about 100 Å (e.g., between about 2 Å and about 10 Å, between about 6 Å and about 20 Å, between about 10 Å and about 30 Å, between about 15 Å and about 40 Å, between about 35 Å and about 60 Å, between about 45 Å and about 80 Å, and between about 70 Å and about 100 Å). By way of example and not limitation, metal nitride layer 240 can include titanium nitride and can have a thickness between about 10 Å and 1000 Å (e.g., between about 10 Å and about 100 Å, between about 60 Å and about 200 Å, between about 150 Å and about 300 Å, between about 270 Å and about 500 Å, between about 450 Å and about 800 Å, between about 500 Å and about 950 Å, and between about 750 Å and about 1000 Å). In some embodiments, polysilicon layer 250 has a thickness 250T that ranges between about 10 nm and about 300 nm (e.g., between about 10 nm and about 100 nm, between about 50 nm and about 200 nm, and between about 150 nm and about 300 nm).

Further, polysilicon resistor structure 100 includes spacer structures 260 on its sidewalls along its length 100L as shown in FIG. 2 (but not shown in FIG. 1 for simplicity). By way of example and not limitation, spacer structures 260 can include a nitride, such as silicon nitride, and may include one or more layers.

In some embodiments, polysilicon layer 250 includes silicided portions 270, which define contact regions 105 and 110 where contact structures (e.g., contact structures 115 shown in FIG. 1) are formed. In some embodiments, silicided portions 270 are cladding silicide layers spaced apart and located on opposite ends of polysilicon resistor structure 100 as shown in FIG. 2. In some embodiments, the entire top surface of polysilicon layer 250 can be silicided as shown for polysilicon resistor structure 300 in FIG. 3.

Figure 4:
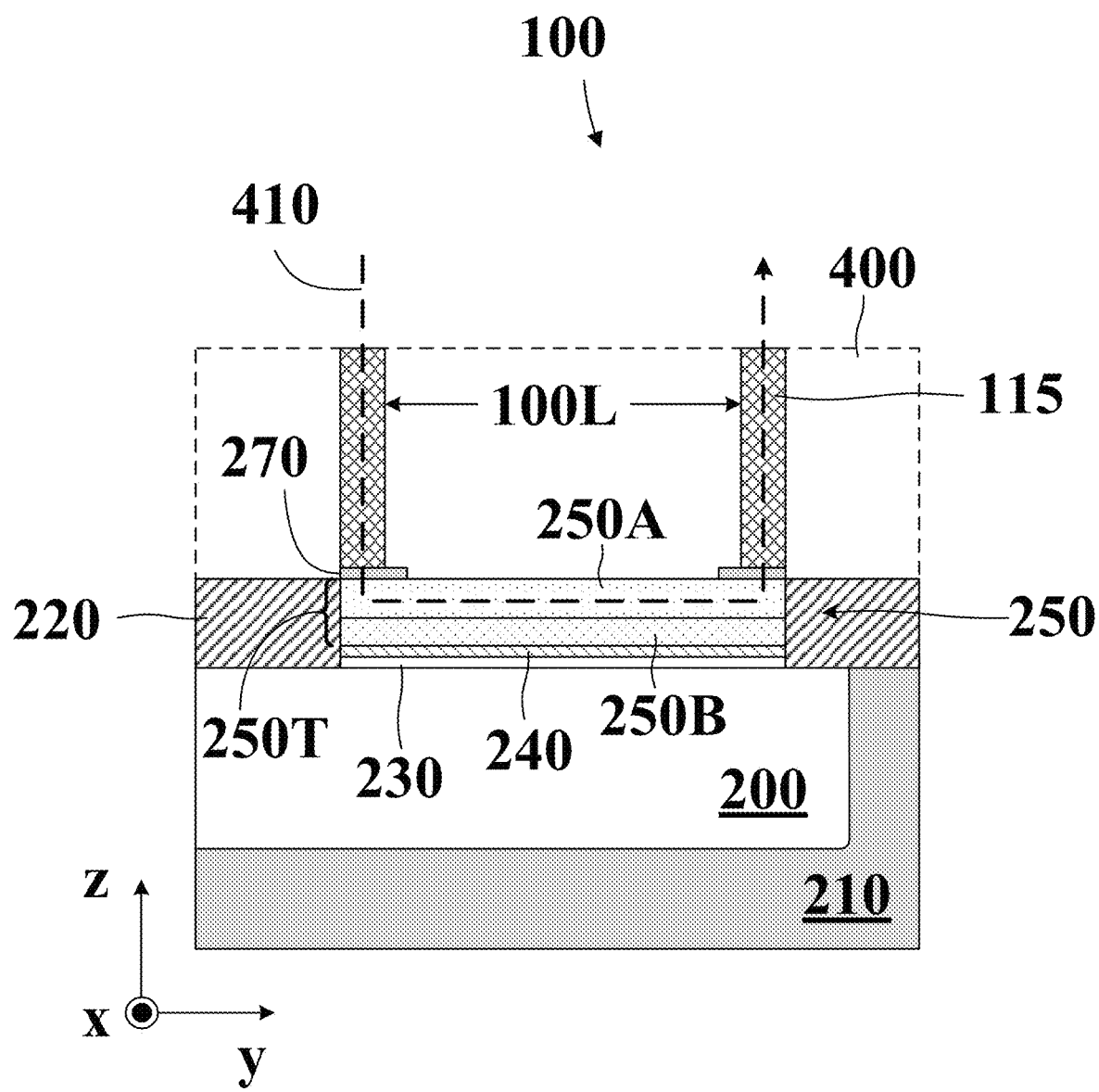
FIG. 4 is a cross-sectional view of a non-silicided polysilicon resistor structure, in accordance with some embodiments.

In some embodiments, polysilicon layer 250 includes a top doped layer and an underlying bottom intrinsic (e.g., un-doped) layer, which is in direct contact with metal nitride layer 240. For example, FIG. 4 is a cross-sectional view of FIG. 2 along cut line AB where polysilicon layer 250 is shown to have a top doped layer 250A and a bottom intrinsic (un-doped) layer 250B. Here, polysilicon layer 250 is referred to as "partially doped" because top doped layer 250A is thinner than thickness 250T of polysilicon layer 250. In some embodiments, the thickness of top doped layer 250A is equal to or greater than about 50 Å when measured from the top surface of polysilicon layer 250. If doped layer 250A is thinner than about 50 Å, the resistance of resistor structure 100 may be unacceptably high. In some embodiments, the entire thickness 250T of polysilicon layer 250 (e.g., between about 10 nm and about 300 nm) is doped e.g., the thickness of the bottom intrinsic layer 250B can be nominally zero when polysilicon layer 250 is uniformly doped. In this case, polysilicon layer 250 is referred to as "fully doped."

In some embodiments polysilicon layer 250 can be doped via an implant process. By way of example and not limitation, polysilicon layer 250 can be doped during the process of forming source/drain regions in transistor devices. By way of example and not limitation, a sacrificial hard mask layer (not shown in FIG. 4) can be formed on the top surface of polysilicon layer 250 to modulate the implant depth and thus the thickness of top doped layer 250A. For example, the thickness of the resulting doped layer 250A can be inversely proportional to the thickness of the sacrificial hard mask layer. The hard mask layer can be, for example, a stacked layer of silicon oxide and silicon nitride. In some embodiments, the thickness of top doped layer 250A can be modulated through implant process conditions (e.g., the implant energy). In some embodiments, the dopant dose for top doped layer 250A can range from about $1 \times 10^{12}$ cm$^{-2}$ to about $5 \times 10^{16}$ cm$^{-2}$ and the dopant species can include either n-type (e.g., phosphorous, arsenic, or antimony) or p-type (e.g., boron, indium, or gallium).

FIG. 4 further includes contact structures 115 in physical contact with silicided portions 270 of polysilicon layer 250. By way of example and not limitation, contact structures 115 include a conductive material, such as tungsten or cobalt. Additionally, contact structures 115 are embedded in a dielectric layer 400. In some embodiments, dielectric layer 400 is an interlayer dielectric (ILD) that includes un-doped silicate glass (USG), phosphosilicate glass (PSG), borophosphosilicate glass (BPSG), a low-k dielectric (e.g., with a k-value lower than about 3.9), or combinations thereof.

According to some embodiments, during the resistor's operation, electric current 410 ("current 410") passes through top doped layer 250A of polysilicon layer 250 along the resistor's length 100L as shown in FIG. 4. Current 410 enters and exits the resistor structure through contact structures 115. According to some embodiments, the electrical contact formed between contact structures 115 and silicided portions 270 has negligible resistance compared to the total resistance of resistor structure 100.

According to some embodiments, the resistance of resistor structure 100 can be modulated. By way of example and not limitation, the resistance of resistor structure 100 can be based on (i) the dopant concentration of top doped layer 250A, (ii) the thickness of top doped layer 250A, (iii) the length 100L and/or width 100W of resistor structure 100 shown in FIGS. 1 and 2, or (iv) combinations thereof. In some embodiments, for a fixed dopant concentration and thickness for top doped layer 250A, the resistance of resistor structure 100 can be modulated through the structure's physical dimensions (e.g., 100L and/or 100W). In some embodiments, the physical dimensions of resistor structure 100 can be defined by patterning—e.g., by photolithography and etching operations.

Figure 3:
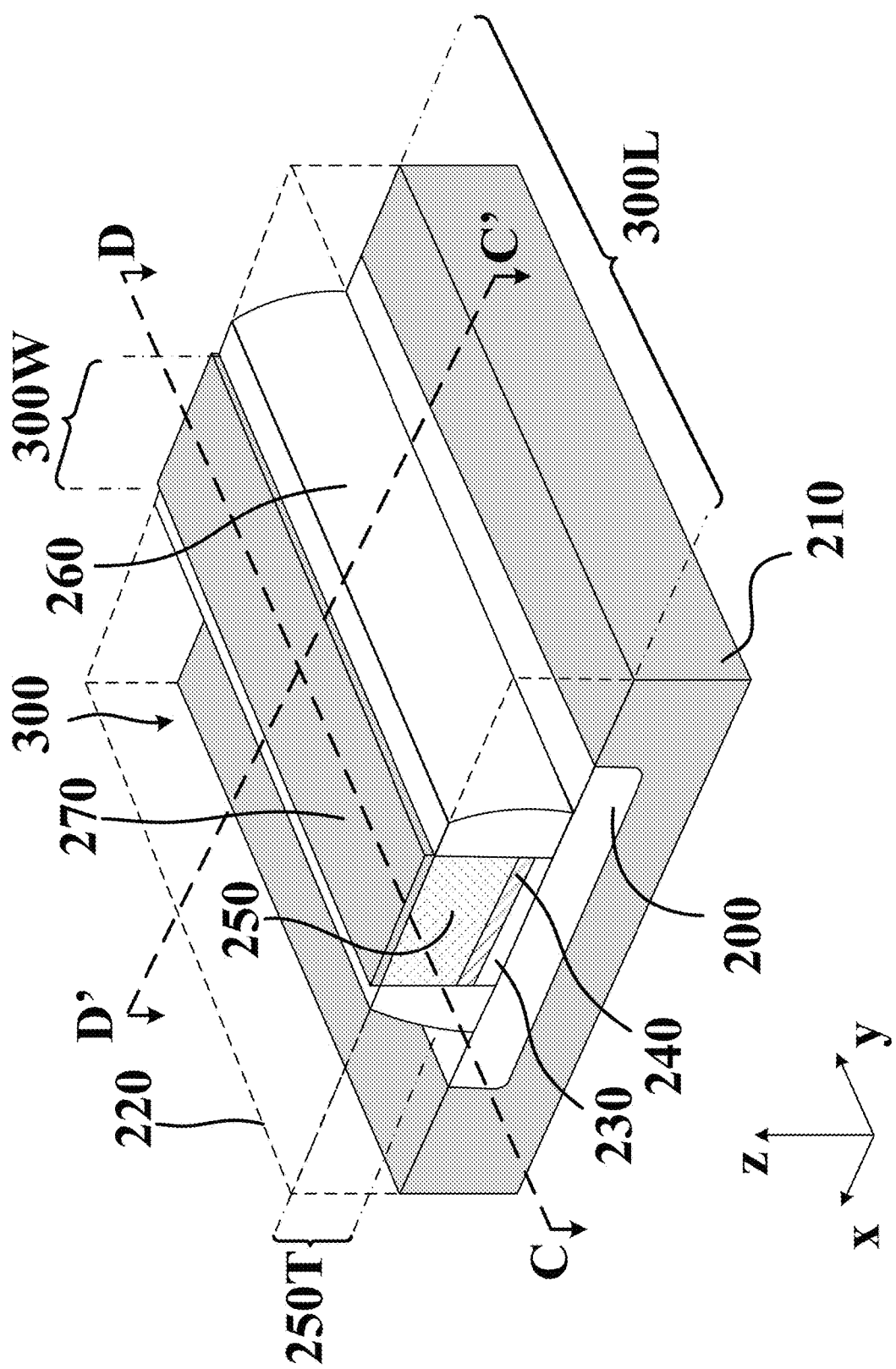
FIG. 3 is an isometric view of a silicided polysilicon resistor structure, in accordance with some embodiments.
Figure 5:
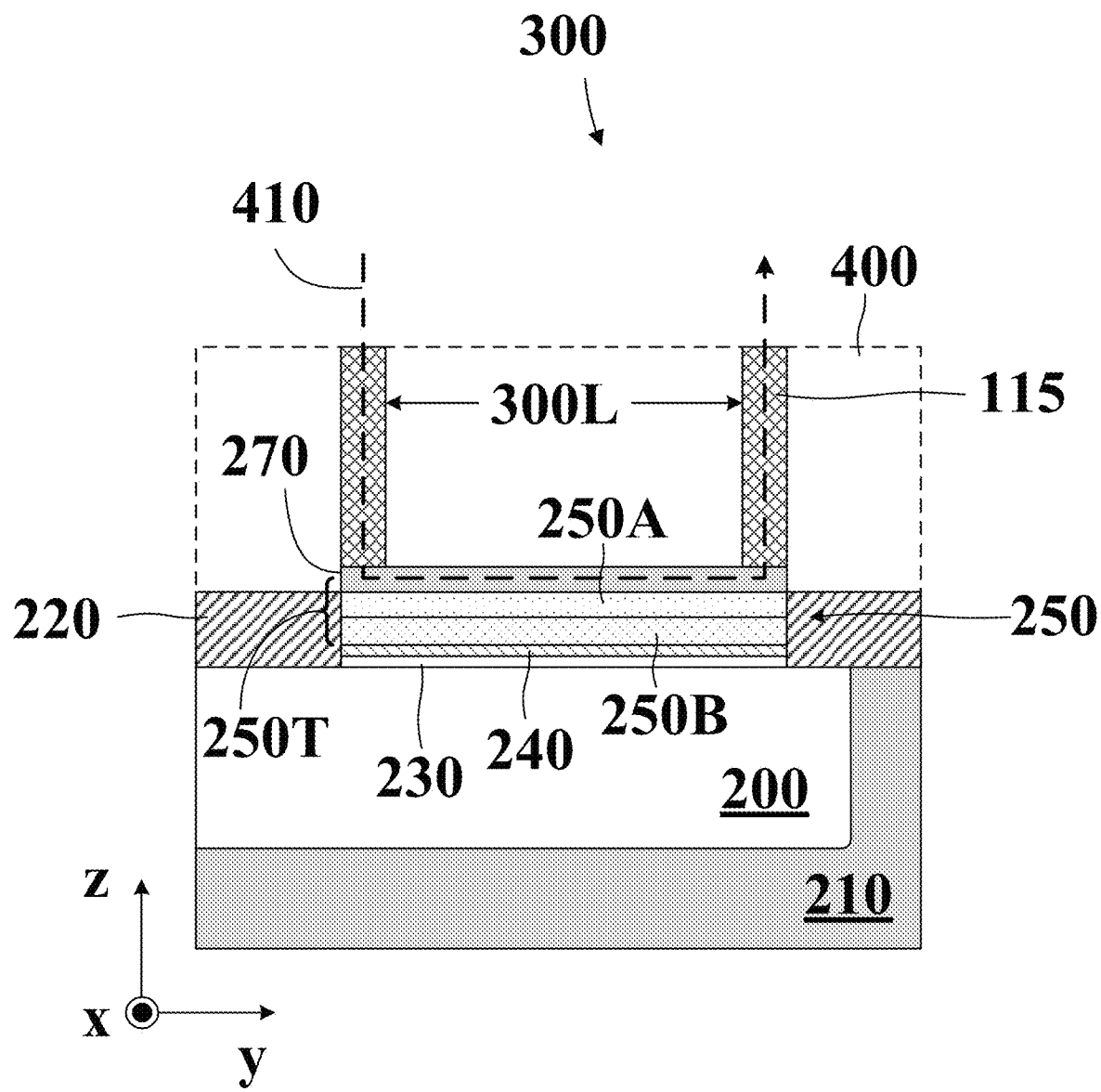
FIG. 5 is a cross-sectional view of a silicided polysilicon resistor structure, in accordance with some embodiments.

FIG. 5 is a cross sectional view of polysilicon resistor structure 300 across cut line CD shown in FIG. 3. Polysilicon resistor structure 300 shown in FIGS. 3 and 5 differs from polysilicon resistor structure 100 shown in FIGS. 2 and 4 in that the entire top surface of polysilicon layer 250 is silicided. In other words, silicided portion 270 in polysilicon resistor structure 300 covers the entire surface of polysilicon layer 250. In some embodiments, another difference between polysilicon resistor structures 100 and 300 is their operation. For example, resistor structure 100 operates by flowing current 410 through top doped layer 250A of polysilicon layer 250, while resistor structure 300 operates by flowing current 410 through silicided portion 270 of polysilicon layer 250. Consequently, polysilicon resistor structures 100 and 300 have different electrical characteristics (e.g., resistance and current density ratings). In some embodiments, polysilicon resistor structure 100 is referred to as a "non-silicided polysilicon resistor" and polysilicon resistor structure 300 is referred to as a "silicided polysilicon resistor." In some embodiments, silicided polysilicon resistors (e.g., polysilicon resistor structure 300) can be combined with non-silicided polysilicon resistors (e.g., polysilicon resistor structure 100) in the same IC. For example, silicided polysilicon resistors (e.g., polysilicon resistor structure 300) and non-silicided polysilicon resistors (e.g., polysilicon resistor structure 100) can be formed on the same substrate depending on the resistance and current density requirements of the IC.

The silicide material in silicided portions 270 of polysilicon resistor structures 100 and 300 can be the same or different. By way of example and not limitation, the silicide material can be nickel silicide, cobalt silicide, tungsten silicide, titanium silicide, or any other suitable silicide material. In some embodiments, the thickness of silicided portion 270 in resistor structure 300 shown in FIGS. 3 and 5 ranges between about 50 Å and about 2000 Å.

Similar to polysilicon resistor structure 100, polysilicon resistor structure 300 can include a partially-doped or a fully-doped polysilicon layer 250. In other words, polysilicon layer 250 can have a top doped layer 250A that extends partially in polysilicon layer 250 or occupies the entire thickness 250T of polysilicon layer 250 shown in FIG. 3.

In some embodiments, polysilicon resistor structures 100 and 300 can be formed in a logic device area of an IC and share common fabrication operations with memory and/or logic device structures. For example, polysilicon layer 250 can be formed when sacrificial polysilicon gate structures are formed in logic devices (e.g., FETs). Further, polysilicon layer 250 can be doped during the process of forming source-drain regions in the memory array and/or the logic device areas of the IC. In another example, silicided portion 270 of polysilicon layer 250 can be formed concurrently with a silicidation process performed for the polysilicon gates of transistors in the memory array. In other words, in some embodiments, the formation process of polysilicon resistor structures 100 and 300 can be integrated with the formation process of memory array and logic device structures without the need for additional manufacturing operations.

In some embodiments, non-silicided polysilicon resistors, like polysilicon resistor structure 100, has a sheet resistance between about 500 Ω/square and about 1000 Ω/square for a p-type doped polysilicon layer and between about 100 Ω/square and about 500 Ω/square for an n-type doped polysilicon layer. In some embodiments, silicided polysilicon resistors, like polysilicon resistor structure 300, can have a sheet resistance between about 1 Ω/square and about 50 Ω/square for a p-type doped polysilicon layer and between about 1 Ω/square and about 50 Ω/square for an n-type doped polysilicon layer. In some embodiments, the silicided polysilicon resistors have a lower sheet resistance compared to the non-silicided polysilicon resistors. As a result, the maximum current density (current carrying capability) for each type of polysilicon resistor (e.g., silicided or non-silicided) can be different. For example, the maximum current density (Jmax) for a non-silicided polysilicon resistor can range between about 0.1×W and about 1×W mA and for a silicided polysilicon resistor can range between about 1×W and about 10×W mA, where W is the width of the resistor structure (e.g., 100W and 300W shown in FIGS. 2 and 3, respectively). According to some embodiments, both polysilicon resistors types (e.g., non-silicided and silicided)

exhibit maximum current density (Jmax) values with limited temperature dependency compared to MG and TiN resistors. For example, both polysilicon resistor types can carry a large percentage of their maximum current density (Jmax) for a wide range of temperatures. By way of example and not limitation, a polysilicon resistor operated at 110° C. exhibits a Jmax that is about 1 to about 10% lower than its Jmax value when operated at 125° C. In comparison, the MG and TiN resistors operated at 110° C. exhibit a Jmax that is about 30% to about 90% lower than their Jmax value when operated at 125° C.

Figure 6:
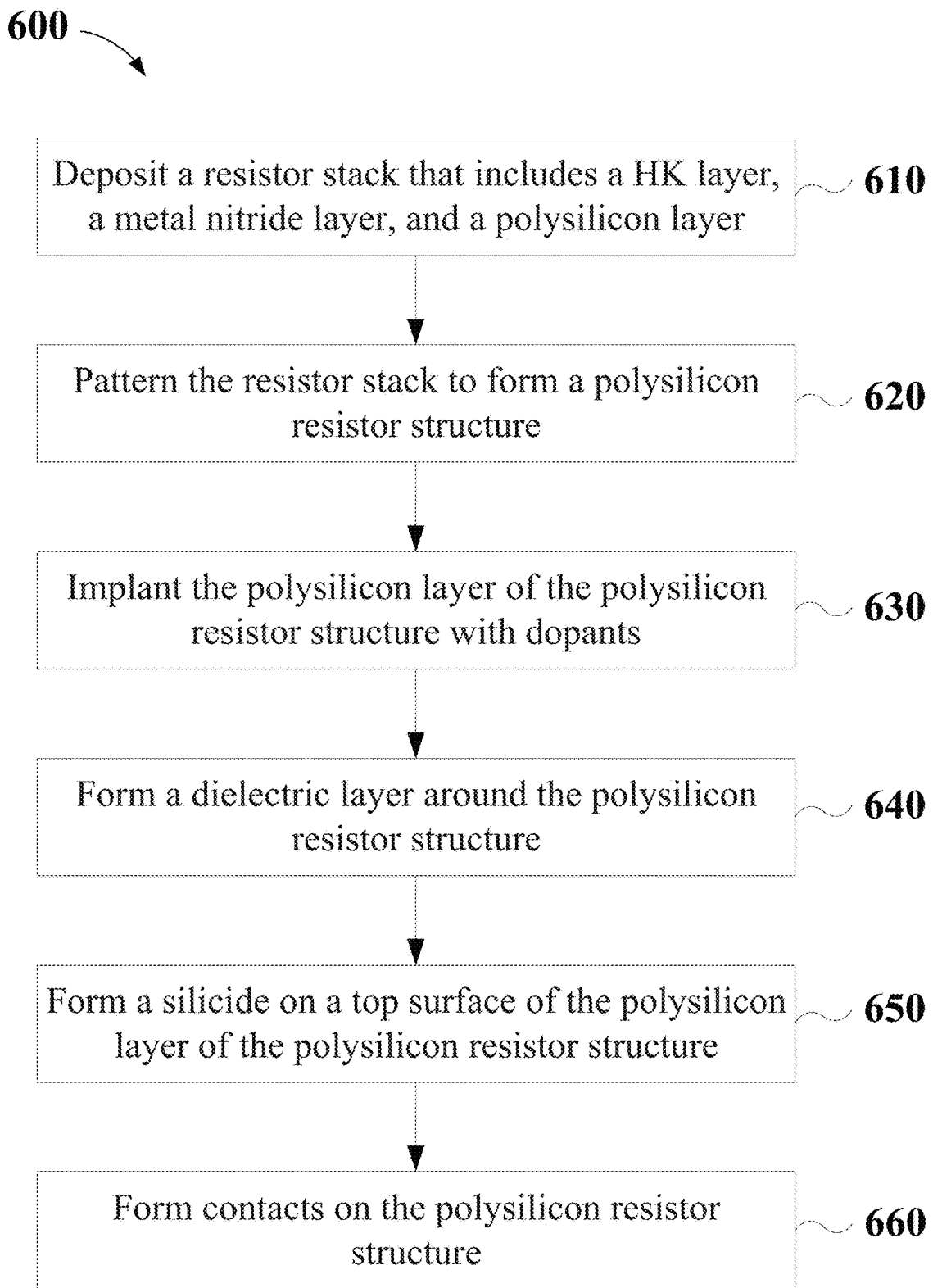
FIG. 6 is flow chart describing a method for forming silicided and non-silicided polysilicon resistor structures, in accordance with some embodiments.

FIG. 6 is a flow chart of a method 600 for forming non-silicided and silicided polysilicon resistors. Other fabrication operations may be performed between the various operations of method 600 and may be omitted merely for clarity. Embodiments of the present disclosure are not limited to method 600. Method 600 will be described in reference to FIGS. 1-5 and 7-11.

Figure 7:
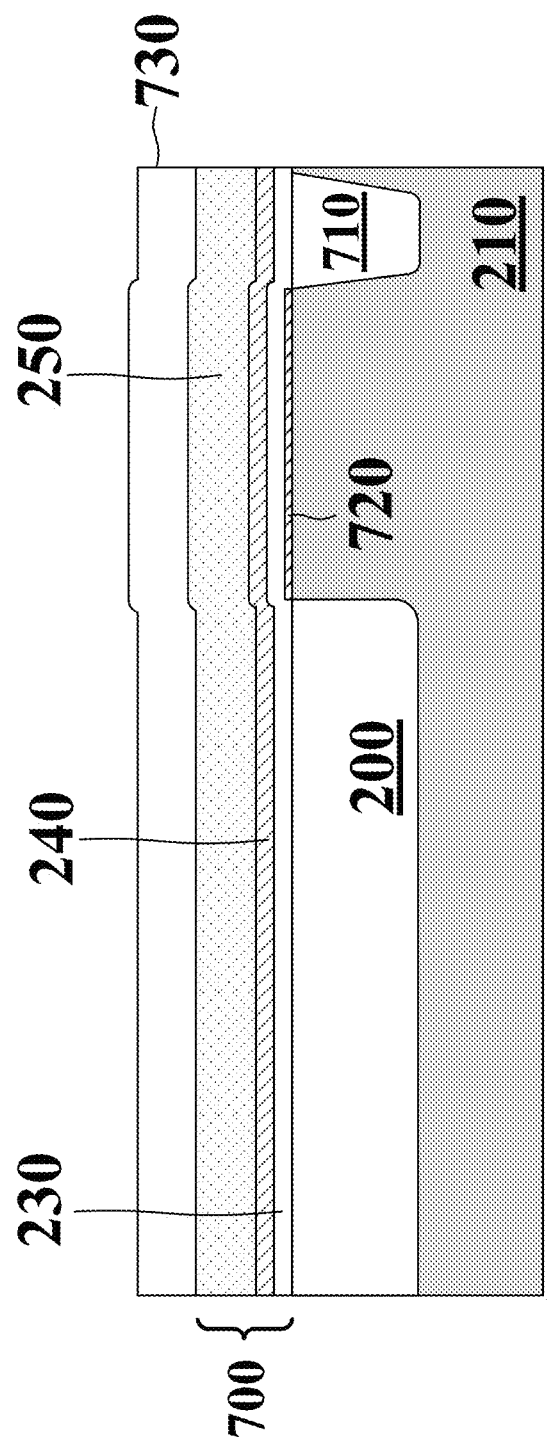
FIGS. 7-11 are cross-sectional views describing a fabrication process of silicided and non-silicided polysilicon resistor structures, in accordance with some embodiments.

In referring to FIG. 6, method 600 begins with operation 610 and the deposition of a resistor stack with a HK layer, a metal nitride layer, and a polysilicon layer. The resistor stack of operation 610 includes the same layers with polysilicon resistors structures 100 and 300 shown in FIGS. 2-5—for example, HK layer 230, metal nitride layer 240, and polysilicon layer 250. In operation 610, the resistor stack can be blanket deposited over the semiconductor substrate. For example, FIG. 7 is a cross-sectional view along cut lines A'B' and C'D' of FIGS. 2 and 3 respectively and shows a resistor stack 700 blanket deposited over semiconductor substrate 210 according to operation 610. In some embodiments, semiconductor substrate 210 includes additional isolation region(s) 710. In some embodiments, isolation region(s) 710 are filled with dielectric material that can be different from the dielectric material in isolation region 200. By way of example and not limitation, isolation region 200 can include a low-k dielectric material (e.g., a material with a k-value less than about 3.9), while isolation region(s) 710 can include a silicon oxide with a k-value substantially equal to about 3.9.

In some embodiments, prior to depositing HK layer 230, an interfacial layer 720 is grown on semiconductor substrate 210 to improve the interface quality between semiconductor substrate 210 and the deposited HK layer 230. In some embodiments, interfacial layer 720 includes a silicon dioxide layer with a thickness between about 3 Å and about 30 Å.

In some embodiments, a hard mask layer 730 is deposited over the resistor stack 700, as shown in FIG. 7. Hard mask layer 730 can be silicon oxide, silicon nitride, other suitable dielectrics, or combinations thereof. In some embodiments, hard mask layer 730 protects the underlying layers during subsequent processing.

Figure 8:
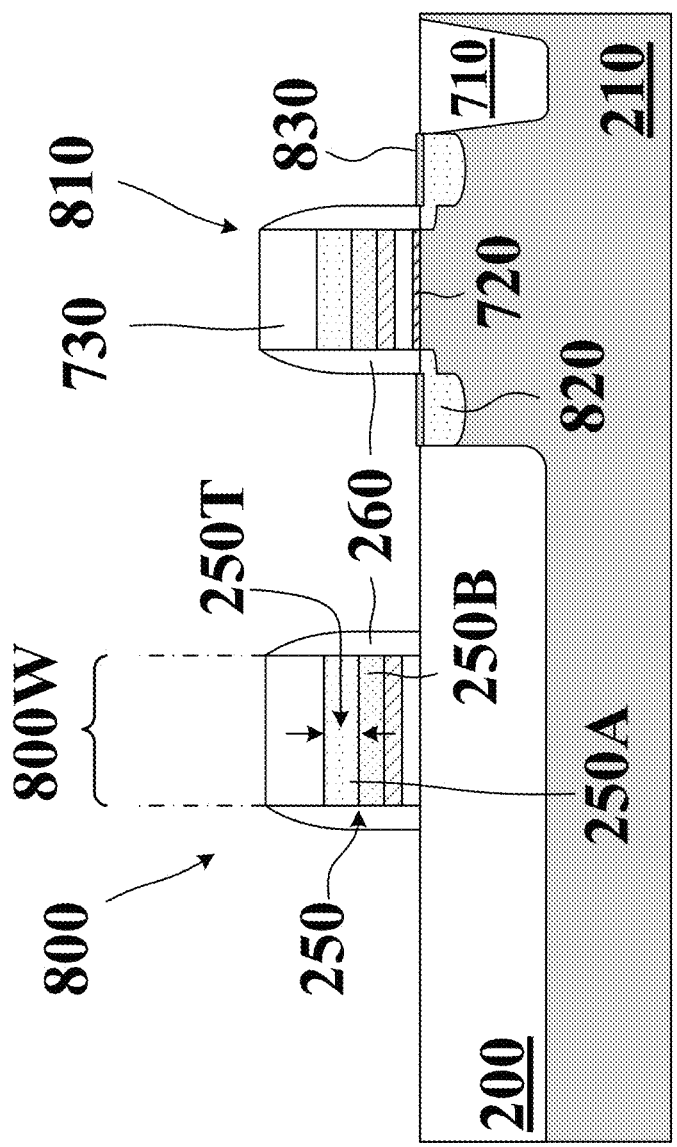

In referring to FIGS. 6 and 8, method 600 continues with operation 620 and the patterning of resistor stack 700 to form a polysilicon resistor structure 800. In some embodiments, patterning of resistor stack 700 is accomplished via photolithography and etching operations. During the patterning process of operation 610, the physical dimensions of polysilicon resistor structure 800—for example, width 800W and a length dimension (not shown in FIG. 8)—can be defined as discussed above with respect to polysilicon resistor structures 100 and 300 in FIGS. 2 and 3.

In some embodiments, alongside polysilicon resistor structure 800, transistor structure 810 can be formed on semiconductor substrate 210 and between isolation regions 200 and 710 as shown in FIG. 8. The physical dimensions of transistor structure 810 can be independent from the physical dimensions of polysilicon resistor structure 800. In other words, the design rules governing transistor structures 810 and polysilicon resistor structure 800 can be different. This is because transistor structure 810 is an active device with different functionality than polysilicon resistor structure 800. Further, additional devices (e.g., transistors and capacitors) or arrays (e.g., memory arrays) may be formed in other areas of semiconductor substrate 210 either prior to or during the process of forming polysilicon resistor structure 800 and transistor structure 810. These other structures are not shown in FIG. 8 for simplicity and are within the spirit and the scope of this disclosure.

In some embodiments, multiple resistor structures, like polysilicon resistor structure 800, can be "defined" (formed) during the patterning process described in operation 620. Further, not all the polysilicon resistor structures formed according to method 600 may have the same physical dimensions.

In some embodiments, lightly doped implants may be used to form the source-drain extension regions of transistor structure 810. These extension regions are not shown in FIG. 8 for simplicity. According to some embodiments, spacer structures 260 are formed on sidewall surfaces of polysilicon resistor structure 800 and transistor structures 810, as shown in FIG. 8. By way of example and not limitation, spacer structures 260 can be formed by a blanket deposition of a spacer material (e.g., silicon nitride) followed by an anisotropic etching process that selectively removes the spacer material from horizontal surfaces of the structures shown in FIG. 8.

In referring to FIG. 6, method 600 continues with operation 630 where polysilicon layer 250 of polysilicon resistor structure 800 is implanted with dopants to form a top doped layer 250A. In some embodiments, referring to FIG. 8 and during the implant process described in operation 630, source-drain regions of transistor structure 810 can be formed in semiconductor substrate 210 adjacent to spacer structures 260. In other words, during operation 630, top doped layer 250A in polysilicon resistor structure 800 and source-drain regions 820 in transistor structure 810 are concurrently formed. As a result, source-drain regions 820 and top doped layer 250A can share the same type of dopants (e.g., n-type or p-type). According to some embodiments, a benefit of operation 630 is that top doped layer 250A in a resistor structure and source-drain regions 820 in a transistor structure are formed from a single operation (operation 630). This eliminates the need for independent processing operations to form top doped layer 250A and source-drain regions 820.

In some embodiments, the thickness of top doped layer 250A when measured from a top surface of polysilicon layer 250 is between about 5 nm and about 200 nm or about the total thickness (250T) of polysilicon layer 250—which can range from about 10 nm to about 300 nm (e.g., between about 10 nm and about 100 nm, between about 50 nm and about 200 nm, and between about 150 nm and about 300 nm).

According to some embodiments, a silicide 830 can be formed on source-drain regions 820 of transistor structure 810. Silicide 830 can be formed, for example, by blanket depositing metal (e.g., titanium, nickel, cobalt, tungsten, etc.) and subsequently annealing semiconductor substrate 210 to initiate the silicidation reaction between the deposited metal and the semiconductor material (e.g., silicon) in source-drain regions 820. Any un-reacted metal can be removed with a wet etching process.

Figure 9:
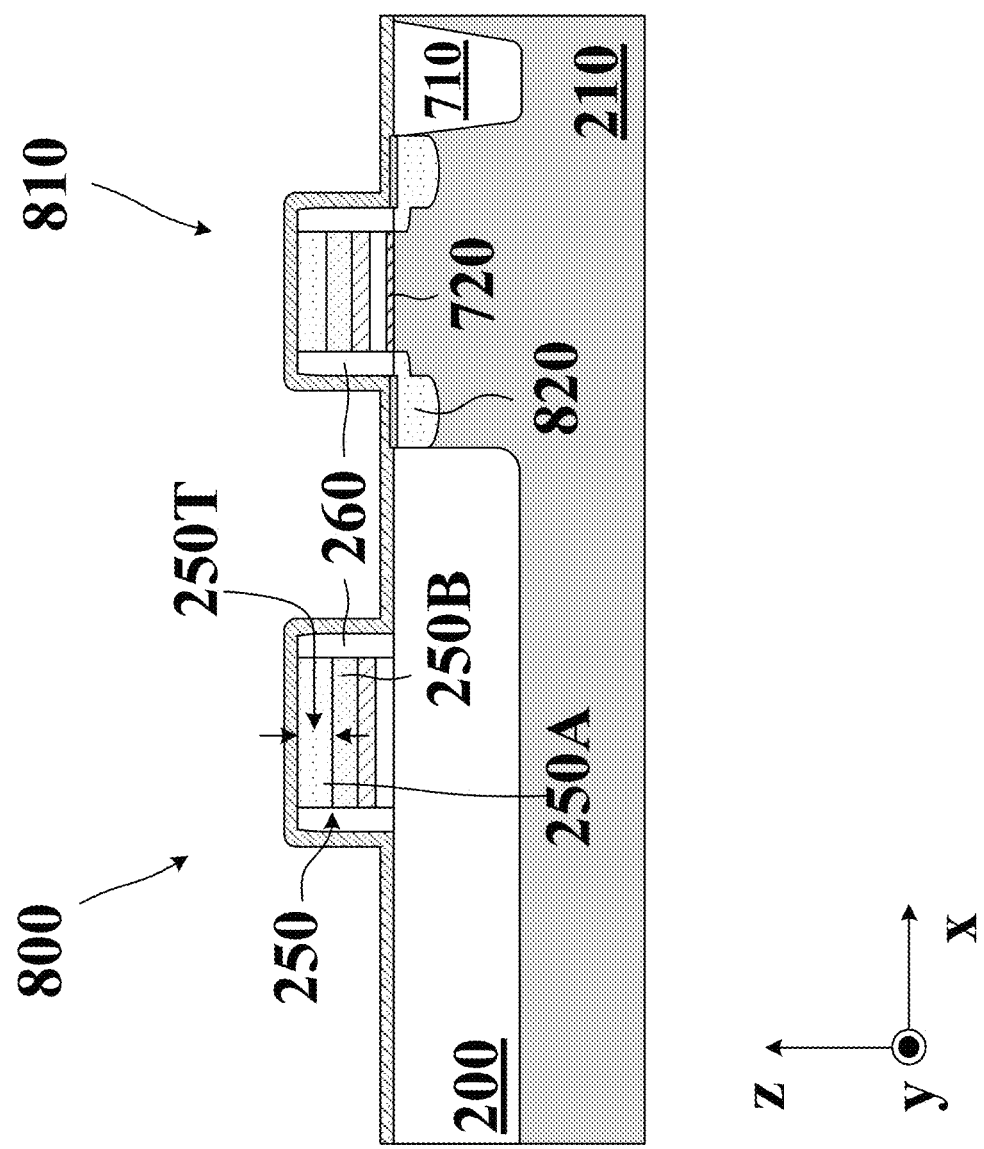

In some embodiments, as shown in FIG. 9, hard mask layer 730 is removed from polysilicon resistor structure 800 and transistor structure 810, and an etch stop layer 900 can be formed over polysilicon resistor structure 800 and transistor structure 810. Etch stop layer 900 can extend over isolation regions 200/710, source-drain regions 820, and exposed portions of semiconductor substrate 210. In some embodiments, etch stop layer 900 can cover other structures (e.g., memory arrays) on semiconductor substrate 210 not shown in FIG. 9. It is noted that etch stop layer 900 is not shown in FIGS. 2 and 3 for simplicity.

Figure 10:
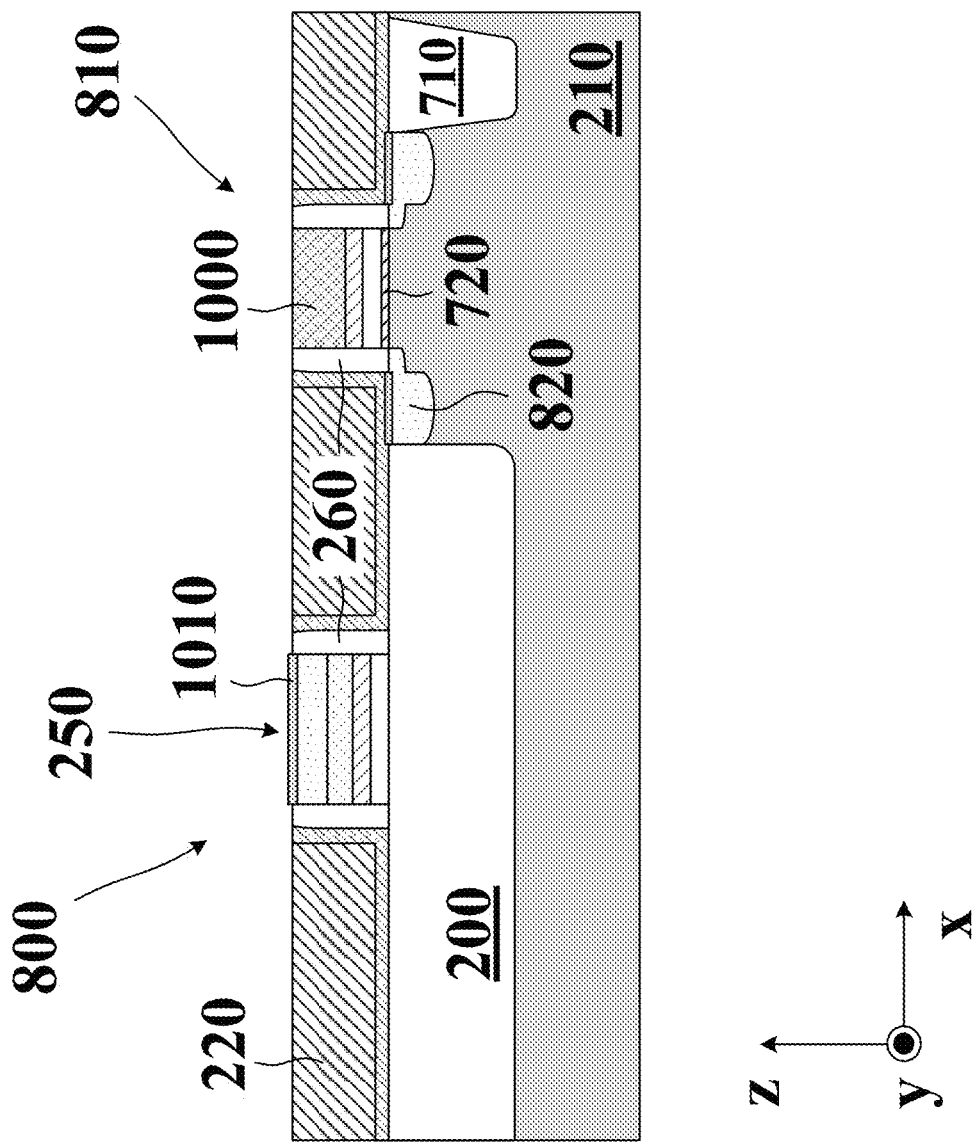

In referring to FIG. 6, method 600 continues with operation 640 and the process of forming a dielectric layer around polysilicon resistor structure 800. In some embodiments, the dielectric layer of operation 640 is dielectric layer 220 shown in FIGS. 2-5. By way of example and not limitation, the dielectric layer (e.g., dielectric layer 220) can be formed by blanket depositing a dielectric material over polysilicon resistor structure 800, transistor structure 810, isolation regions 200/710, source-drain regions 820, and exposed portions of semiconductor substrate 210. In some embodiments, the dielectric layer can cover other structures (e.g., memory arrays) on semiconductor substrate 210 not shown in FIG. 10. As shown in FIG. 10, a chemical mechanical polishing (CMP) process can be subsequently used to planarize and remove excess dielectric material from the top of polysilicon resistor structure 800 and transistor structure 810. In some embodiments, etch stop layer 900 acts a stopping layer for the CMP process of operation 640.

In a subsequent operation, semiconductor material 250 in transistor structure 810 is removed and replaced by a metal gate electrode 1000. In some embodiments, metal gate electrode 1000 includes one or more metallic layers.

In referring to FIGS. 6 and 10, method 600 continues with operation 650 where a silicide 1010 is formed on the top surface of polysilicon layer 250 of polysilicon resistor structure 800. According to some embodiments, the surface area of silicide 1010 corresponds to silicided portions 270 shown in FIGS. 2 and 3. As discussed above with respect to FIGS. 2 and 3, silicided portions 270 may extend to the entire surface of polysilicon layer 250 as shown in FIG. 3 to form a silicided polysilicon resistor structure 800. In some embodiments, silicide 1010 is restricted to the "edges" of the resistor structure, as shown in FIG. 2, resulting in a non-silicided polysilicon resistor structure 800. If a non-silicided resistor structure is desired, like resistor structure 100 in FIG. 2, the "not-to-be silicided portions" of top polysilicon layer 250 can be covered with a mask layer (e.g., an oxide or nitride) prior to the silicidation process. If a silicided resistor structure is desired, like resistor structure 300 in FIG. 3, polysilicon layer 250 may be exposed during the silicidation process.

The silicidation process can be similar to the silicidation process described above for the source-drain regions 820. In some embodiments, during the silicidation process of operation 650, other structures on semiconductor substrate 210 may also be silicided. For example, polysilicon gate structures in memory arrays, like in non-volatile memory arrays such as embedded flash memory arrays, can also be silicided concurrently with the resistor structures. This eliminates the need for independent silicidation processes for the process of forming silicide 1010 in polysilicon resistor structure 800 and on other structures on semiconductor substrate 210.

Figure 11:
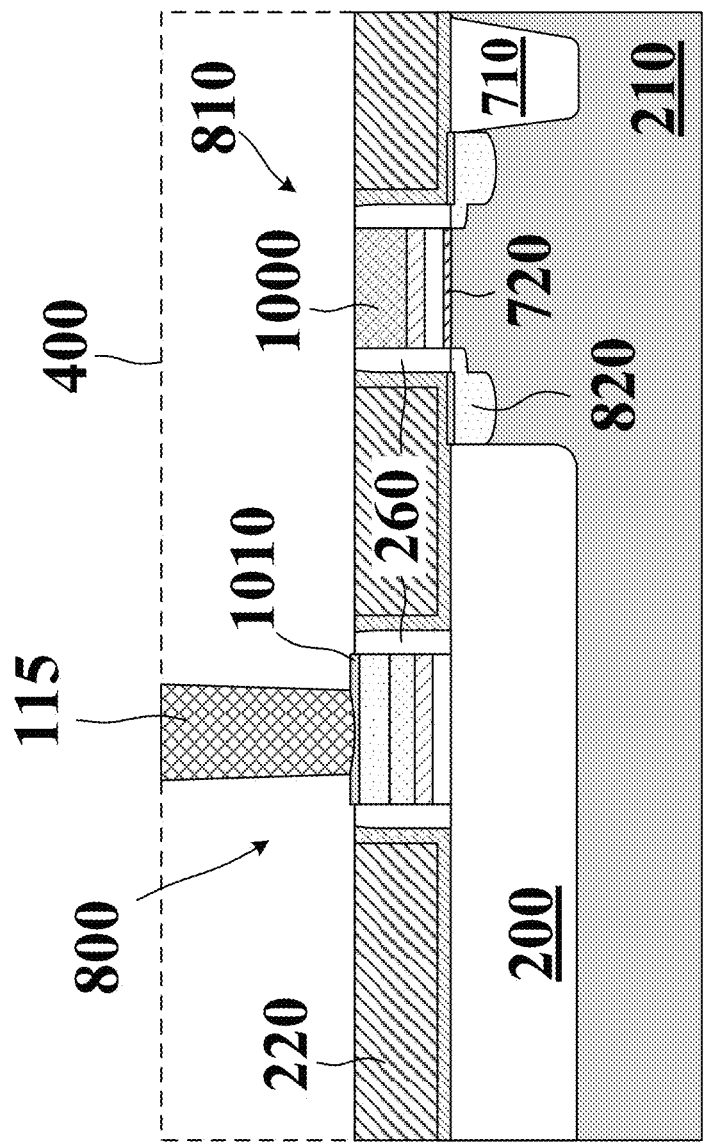

In referring to FIGS. 6 and 11, method 600 continues with operation 660 and the process of forming a contact on polysilicon resistor structure 800. This can be accomplished by depositing another dielectric layer, like dielectric layer 400 shown in FIGS. 4 and 5, over dielectric layer 220. In some embodiments, the dielectric layer of operation 660 (e.g., dielectric layer 400) is blanket deposited over the structures on semiconductor substrate 210 and it is subsequently planarized as shown in FIG. 11. Next, dielectric layer 400 is etched to form a contact opening that partially exposes silicide 1010 of polysilicon resistor structure 800. A conductive material is deposited to fill the etched opening. Excess conductive material on the top surface of dielectric layer 400 is subsequently planarized to form contact structure 115 shown in FIG. 11.

In some embodiments, more than one contact structure 115 can be formed concurrently on polysilicon resistor structure 800 as shown in FIG. 1. Further, contact structure 115 is aligned and physically connected to a silicided portion 270 of polysilicon layer 250 shown in FIGS. 2-5. This ensures a low contact resistance between contact structure 115 and polysilicon resistor structure 800. According to some embodiments, additional contacts can be formed on other structures of the IC including contacts to source-drain regions 820, contacts to metal gate electrode 1000, and contact to other structures not shown in FIG. 11, such as memory arrays, capacitor structures, etc.

Embodiments of the present disclosure are directed to a method for forming polysilicon resistors that combine HK dielectrics and polysilicon. These polysilicon resistors can be silicided or non-silicided, exhibit a wider sheet resistance range, and a higher current density capability over a wider range of temperatures compared to MG and TiN resistors. The resulting polysilicon resistors, according to the embodiments described herein, can be fabricated at a low cost without substantial changes to the fabrication process alongside with HK/MG FETs and other devices such as memory arrays. In some embodiments, the resulting silicided and non-silicided polysilicon resistors offer a current density between about 1×W and about 10×W mA and between about 0.1×W and about 1×W mA respectively, where W is the width of the resistor structure. Further, the polysilicon resistors described herein are compatible with fabrications methods used for HK/MG devices.

In some embodiments, a semiconductor structure includes a semiconductor substrate with spaced apart first and second isolation regions formed therein, where the first isolation region is wider than the second isolation region. The semiconductor structure further includes a resistor structure disposed on the first isolation region, where the resistor structure includes a dielectric layer in contact with the first isolation region, a nitride layer disposed on the dielectric layer, and a semiconductor layer disposed on the nitride layer that includes a doped top portion with a silicide portion formed on opposite ends of the doped top portion. The semiconductor structure also includes a transistor structure disposed between the first and second isolation regions. The transistor structure includes an interfacial layer in contact with the substrate, where the dielectric layer is disposed on the interfacial layer and the nitride layer is disposed on the dielectric layer; a metal gate electrode disposed on the nitride layer; and a source/drain region formed in the substrate and adjacent to the metal gate electrode.

In some embodiments, a method includes depositing a resistor stack on a substrate that includes spaced apart first and second isolation regions, where depositing the resistor stack includes depositing a metal oxide dielectric layer on the substrate, depositing a metal nitride layer on the metal oxide dielectric layer, and depositing a polysilicon layer on the metal nitride layer. Further the method includes patterning the resistor stack to form a polysilicon resistor structure on the first isolation region and a gate structure between the first and second isolation regions, and doping the polysilicon resistor structure to form a doped layer in the polysilicon layer of the polysilicon resistor structure and source-drain regions in the substrate adjacent to the gate structure. Also, the method includes forming a dielectric layer between the polysilicon resistor and gate structures, replacing the polysilicon layer in the gate structure with a metal gate electrode to form a transistor structure with the gate structure and the source-drain regions, and forming a silicide on the doped layer of the polysilicon layer in the polysilicon transistor structure.

In some embodiments, a structure includes a substrate comprising spaced apart first and second isolation regions, a polysilicon resistor on the first isolation region, where the polysilicon resistor includes a metal oxide dielectric layer, a metal nitride layer, and a polysilicon layer having a top surface with a silicided portion. Further the structure includes a transistor structure formed between the first and second isolation regions, where the transistor structure includes the metal oxide dielectric layer, the metal nitride layer, and a metal gate electrode. The structure also includes one or more contacts on the silicided portion of the polysilicon layer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming, on a semiconductor substrate, a stacked polysilicon resistor concurrently with a transistor, the stacked polysilicon resistor having:
      a doped polysilicon layer overlying an un-doped polysilicon layer, and
      a top contact to direct current flow within the doped polysilicon layer along a length of the stacked polysilicon resistor;
   forming sidewall spacers in contact with the un-doped polysilicon layer; and
   siliciding a portion of the doped polysilicon layer to form a silicided polysilicon resistor.

2. The method of claim 1, wherein forming the stacked polysilicon resistor comprises depositing, on the semiconductor substrate, a resistor stack that includes a high-k dielectric layer.

3. The method of claim 1, wherein siliciding the portion of the doped polysilicon layer comprises covering an entire surface of the polysilicon layer with a silicide material.

4. The method of claim 1, wherein siliciding the portion of the doped polysilicon layer comprises siliciding the portion of the doped polysilicon layer with one or more of a nickel silicide, a cobalt silicide, a tungsten silicide, and a titanium silicide.

5. The method of claim 1, wherein the doped polysilicon layer comprises a silicided portion and a non-silicided portion.

6. The method of claim 4, wherein the silicided portion of the doped polysilicon layer has a thickness in the range of about 50 Å to about 2000 Å.

7. The method of claim 1, wherein forming the stacked polysilicon resistor concurrently with the transistor comprises doping the polysilicon layer to a depth of at least 50 nm from a top surface of the polysilicon layer.

8. The method of claim 7, wherein doping the polysilicon layer comprises forming a fully-doped polysilicon layer.

9. The method of claim 1, further comprising forming a contact aligned and physically connected to the silicided polysilicon resistor.

10. A method, comprising:
    depositing a resistor stack on a substrate comprising spaced apart first and second isolation regions, wherein depositing the resistor stack comprises:
       depositing a metal oxide dielectric layer on the substrate;
       depositing a metal nitride layer on the metal oxide dielectric layer; and
       depositing a polysilicon layer on the metal nitride layer;
    patterning the resistor stack to form a polysilicon resistor structure on the first isolation region and a gate structure between the first and second isolation regions;
    doping the polysilicon resistor structure to form a doped layer in the polysilicon layer of the polysilicon resistor structure and source-drain regions in the substrate adjacent to the gate structure, the doped layer overlying an un-doped layer of the polysilicon resistor structure;
    forming sidewall spacers in contact with the un-doped layer of the polysilicon resistor structure;
    forming a dielectric layer between the polysilicon resistor structure and gate structure;
    replacing the polysilicon layer in the gate structure with a metal gate electrode to form a transistor structure comprising the gate structure and the source-drain regions;
    forming a silicide, on the doped layer in the polysilicon layer, to cover the polysilicon resistor structure; and
    forming a top contact to direct current flow within the doped polysilicon layer along a length of the polysilicon resistor structure.

11. The method of claim 10, wherein doping the polysilicon resistor structure comprises forming the doped layer between about 10 nm and about 300 nm below the top contact of the polysilicon resistor structure.

12. The method of claim 10, wherein doping the polysilicon resistor structure and transistor structure comprises forming the doped layer and the source-drain regions with a same dopant species.

13. The method of claim 10, wherein forming the silicide comprises forming the silicide on a top surface of the polysilicon layer of the polysilicon resistor structure.

14. The method of claim 10, wherein the doped layer of the polysilicon resistor structure has a dopant concentration between about $1 \times 10^{12}$ cm$^{-2}$ and about $5 \times 10^{16}$ cm$^{-2}$.

15. The method of claim 10, wherein patterning the resistor stack comprises:
    forming a hard mask layer on the resistor stack;
    patterning the hard mask layer; and removing a portion of the resistor stack not covered by the hard mask layer.

16. The method of claim 10, wherein depositing the metal oxide dielectric layer on the substrate comprises depositing a metal oxide with a dielectric constant higher than about 3.9.

17. A method, comprising:
forming, on a semiconductor substrate, a plurality of polysilicon resistors having in common a polysilicon layer comprising a top doped layer overlying a bottom un-doped layer;
forming sidewall spacers in contact with the bottom un-doped layer;
exposing portions of the common polysilicon layer to a silicidation process to form silicided polysilicon resistors; and
forming a top contact to direct current flow within the top doped layer along a length of the plurality of polysilicon resistors.

18. The method of claim 17, wherein exposing portions of the common polysilicon layer to the silicidation process comprises exposing other polysilicon structures to the silicidation process.

19. The method of claim 18, wherein the other polysilicon structures comprise polysilicon gate structures.

20. The method of claim 17, wherein the silicided polysilicon resistors have a current density range of about 1.0 W mA to about 10 W mA, wherein W is a width of the silicided polysilicon resistors.

\* \* \* \* \*